(12) United States Patent
Takematsu et al.

(10) Patent No.: US 12,096,552 B2
(45) Date of Patent: Sep. 17, 2024

(54) RADIO FREQUENCY MODULE AND COMMUNICATION DEVICE

(71) Applicant: Murata Manufacturing Co., Ltd., Nagaokakyo (JP)

(72) Inventors: Yuji Takematsu, Nagaokakyo (JP); Takanori Uejima, Nagaokakyo (JP); Sho Matsumoto, Nagaokakyo (JP); Tetsuro Harada, Nagaokakyo (JP); Dai Nakagawa, Nagaokakyo (JP); Naoya Matsumoto, Nagaokakyo (JP); Yutaka Sasaki, Nagaokakyo (JP); Yuuki Fukuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 647 days.

(21) Appl. No.: 17/216,722

(22) Filed: Mar. 30, 2021

(65) Prior Publication Data
US 2021/0219419 A1    Jul. 15, 2021

Related U.S. Application Data

(63) Continuation of application No. PCT/JP2019/035132, filed on Sep. 6, 2019.

(30) Foreign Application Priority Data

Nov. 1, 2018 (JP) .................................. 2018-206635

(51) Int. Cl.
*H05K 1/02* (2006.01)
*H03F 3/195* (2006.01)
(Continued)

(52) U.S. Cl.
CPC ............ *H05K 1/0243* (2013.01); *H03F 3/195* (2013.01); *H03F 3/245* (2013.01); *H04B 1/44* (2013.01);
(Continued)

(58) Field of Classification Search
CPC ......... H05K 1/0243; H05K 2201/1006; H05K 2201/10098; H03F 3/195; H03F 3/245;
(Continued)

(56) References Cited

U.S. PATENT DOCUMENTS 8,723,621 B2 * 5/2014 Kidoh .................... H03H 9/725
333/133
10,778,185 B2 * 9/2020 Matsumoto .............. H03H 9/13
(Continued)

FOREIGN PATENT DOCUMENTS

JP           6-85506 A      3/1994
JP      2012-248611 A    12/2012
(Continued)

OTHER PUBLICATIONS

International Search Report and Written Opinion mailed on Nov. 26, 2019, received for PCT Application PCT/JP2019/035132, Filed on Sep. 6, 2019, 6 pages including English Translation.
(Continued)

*Primary Examiner* — Jinsong Hu
*Assistant Examiner* — Rui M Hu
(74) *Attorney, Agent, or Firm* — XSENSUS LLP

(57) ABSTRACT

A radio frequency module includes: a first mounting board having a first principal surface and a second principal surface; a second mounting board having a third principal surface facing the second principal surface and a fourth principal surface; a transmission filter having a first mounting surface facing the second principal surface and a first top surface; and a reception filter having a second mounting surface facing the third principal surface and a second top surface; wherein the transmission and reception filters overlap at least partially in a plan view of the first and second mounting boards, an output terminal of the transmission filter is arranged on the first top surface, an input terminal of
(Continued)

the reception filter is arranged on the second top surface, and the output and input terminals are connected by a conductive member not routed through the first mounting board or the second mounting board.

17 Claims, 6 Drawing Sheets

(51) Int. Cl.
  *H03F 3/24* (2006.01)
  *H04B 1/44* (2006.01)
(52) U.S. Cl.
  CPC .. *H03F 2200/294* (2013.01); *H03F 2200/318* (2013.01); *H03F 2200/451* (2013.01); *H05K 2201/1006* (2013.01); *H05K 2201/10098* (2013.01)
(58) Field of Classification Search
  CPC ......... H03F 2200/294; H03F 2200/318; H03F 2200/451; H04B 1/44; H04B 1/40; H03H 7/46; H03H 9/70; H03H 9/72
  See application file for complete search history.

(56) References Cited

U.S. PATENT DOCUMENTS

| | | | | |
|---|---|---|---|---|
| 11,451,251 | B2* | 9/2022 | Horita | H04B 1/1018 |
| 2004/0075491 | A1* | 4/2004 | Kushitani | H04B 1/44 |
| | | | | 330/51 |
| 2006/0055486 | A1* | 3/2006 | Nakatsuka | H03H 9/564 |
| | | | | 333/133 |
| 2007/0080757 | A1* | 4/2007 | Yahata | H03H 9/706 |
| | | | | 333/133 |
| 2007/0093229 | A1* | 4/2007 | Yamakawa | H01L 23/66 |
| | | | | 455/252.1 |
| 2008/0123302 | A1* | 5/2008 | Kawano | H04B 3/56 |
| | | | | 361/728 |
| 2012/0208473 | A1* | 8/2012 | Aparin | H04B 1/18 |
| | | | | 455/73 |
| 2013/0328640 | A1* | 12/2013 | Tsutsumi | H03H 9/0566 |
| | | | | 333/132 |
| 2014/0118084 | A1* | 5/2014 | Takemura | H03H 9/0576 |
| | | | | 333/133 |
| 2015/0123744 | A1* | 5/2015 | Nishimura | H03H 9/0571 |
| | | | | 310/365 |
| 2016/0079206 | A1 | 3/2016 | Cho et al. | |
| 2017/0012603 | A1* | 1/2017 | Reisner | H01L 25/0657 |
| 2017/0118875 | A1 | 4/2017 | Kumbhat et al. | |
| 2017/0353173 | A1* | 12/2017 | Sakurai | H03H 9/059 |
| 2018/0198436 | A1* | 7/2018 | Joshi | H03H 9/706 |
| 2019/0027800 | A1* | 1/2019 | El Bouayadi | H05K 1/0203 |
| 2019/0066907 | A1* | 2/2019 | Schwersenz | H01F 41/12 |
| 2019/0082536 | A1* | 3/2019 | Park | H04M 1/0277 |
| 2019/0304936 | A1* | 10/2019 | Shaul | H01L 24/20 |
| 2020/0028491 | A1* | 1/2020 | Kuroyanagi | H03H 9/725 |
| 2020/0212951 | A1* | 7/2020 | Hanaoka | H03F 3/68 |
| 2020/0235772 | A1* | 7/2020 | Naniwa | H05K 1/0243 |
| 2020/0344924 | A1* | 10/2020 | Harrigan | H05K 3/368 |
| 2021/0014971 | A1* | 1/2021 | Wang | H05K 1/144 |
| 2021/0050876 | A1* | 2/2021 | Matsumoto | H01L 23/5384 |
| 2021/0144855 | A1* | 5/2021 | Wu | H05K 1/0243 |
| 2021/0297108 | A1* | 9/2021 | Matsumoto | H03H 9/725 |
| 2021/0359661 | A1* | 11/2021 | Murase | H03F 3/195 |
| 2021/0391886 | A1* | 12/2021 | Miyazaki | H03F 3/195 |
| 2022/0278080 | A1* | 9/2022 | Matsumoto | H03F 1/56 |
| 2022/0278703 | A1* | 9/2022 | Shounai | H03H 7/42 |
| 2023/0066774 | A1* | 3/2023 | Nakagawa | H04B 1/38 |
| 2023/0096000 | A1* | 3/2023 | Yoon | H04B 7/0413 |
| | | | | 375/267 |
| 2023/0261382 | A1* | 8/2023 | Uejima | H01L 25/065 |
| | | | | 343/702 |

FOREIGN PATENT DOCUMENTS

| | | |
|---|---|---|
| WO | 2017/033564 A1 | 3/2017 |
| WO | 2018/123699 A1 | 7/2018 |

OTHER PUBLICATIONS

English translation of the International Written Opinion mailed on Nov. 26, 2019, received for PCT Application PCT/JP2019/035132, filed Sep. 6, 2019, 4 pages.

* cited by examiner

RADIO FREQUENCY MODULE AND COMMUNICATION DEVICE

CROSS-REFERENCE TO RELATED APPLICATIONS

The present application is a continuation of and claims priority to PCT/JP2019/035132, filed Sep. 6, 2019, which claims priority to JP 2018-206635, filed Nov. 1, 2018, the entire contents of each are incorporated herein by its reference.

BACKGROUND

1. Field

The present disclosure relates to radio frequency modules and communication devices.

2. Description of the Related Art

There is strong demand for small-sized, lower-profile front end units of wireless communication terminals typified by cellular phones and the like.

International Publication No. 2017/033564 (Patent Document 1) describes a radio frequency module in which a plurality of electronic components is mounted in an inner space formed between two boards. More specifically, the Patent Document 1 describes a configuration in which a transmission filter is mounted on one of the mounting boards and a reception filter is mounted on the other mounting board. The foregoing one of the mounting boards and the foregoing other mounting board are arranged in such a way that the principal surfaces of these mounting boards face each other. According to the foregoing configuration, the radio frequency module can be downsized while suppressing interference between a transmission signal and a reception signal.

SUMMARY

In the radio frequency module described in the Patent Document 1, of the transmission filter and the reception filter that are connected to a common terminal, the transmission filter is mounted on one of the mounting boards, and the reception filter is mounted on the other mounting board. Therefore, this radio frequency module has a structure suitable for downsizing. However, in the case where the common terminal is arranged on the one of the mounting boards or the other mounting board, each of transmission wiring from an output terminal of the transmission filter to the common terminal and reception wiring from an input terminal of the reception filter to the common terminal is routed through either the one of the mounting boards or the other mounting board. Therefore, the sum of the length of the foregoing transmission wiring and the length of the foregoing reception wiring increases. This leads to the issue of an increase in transmission loss of a radio frequency signal.

The present disclosure is made to resolve the foregoing issue, and one object thereof is to provide a radio frequency module and a communication device, in which transmission loss of a radio frequency signal is reduced while downsizing.

In order to achieve the foregoing object, a radio frequency module according to one aspect of the present disclosure includes: a first mounting board having a first principal surface and a second principal surface that are opposite each other; a second mounting board having a third principal surface and a fourth principal surface that are opposite each other, the third principal surface facing the second principal surface; a transmission filter having a first mounting surface and a first top surface that are opposite each other, the transmission filter being arranged in an inner space formed between the first mounting board and the second mounting board and being mounted in such a way that the first mounting surface faces the second principal surface; a reception filter having a second mounting surface and a second top surface that are opposite each other, the reception filter being arranged in the inner space and being mounted in such a way that the second mounting surface faces the third principal surface; and a common terminal being arranged on the first principal surface or the fourth principal surface, the common terminal being electrically connected to an output terminal of the transmission filter and an input terminal of the reception filter, wherein when the first mounting board and the second mounting board are seen in a plan view, the transmission filter and the reception filter overlap with one another at least partially, the output terminal of the transmission filter is arranged on the first top surface, the input terminal of the reception filter is arranged on the second top surface, and the output terminal of the transmission filter and the input terminal of the reception filter are connected by a conductive member, the conductive member being arranged in the inner space and not being routed through the first mounting board or the second mounting board.

Other features, elements, characteristics and advantages of the present disclosure will become more apparent from the following detailed description of preferred embodiments of the present disclosure with reference to the attached drawings.

DESCRIPTION OF THE PREFERRED EMBODIMENTS

Figure 1:
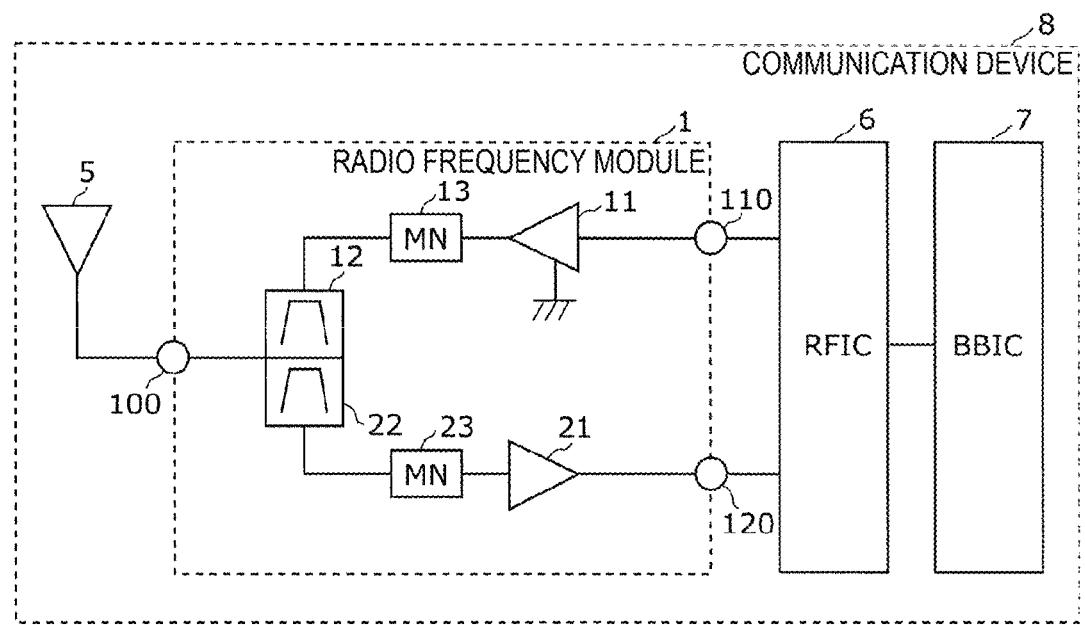
FIG. 1 is a circuit configuration diagram of a radio frequency module and a communication device according to an embodiment.

Hereinafter, an embodiment of the present disclosure will be described in detail using a working example, modified examples, and drawings. Note that the working example and the modified examples, which will be described below, each illustrate a comprehensive or specific example. Numeric values, shapes, materials, constituent elements, arrangements and connection modes of the constituent elements, and the like illustrated in the following working example and modified examples are mere examples, and not intended to limit the present disclosure. Of constituent elements in the following working example and modified examples, the constituent elements that are not described in an independent claim will be described as optional constituent elements. Further, dimensions or ratios of dimensions of constituent elements illustrated in the drawings are not necessarily be precise.

Note that, in the following working example and modified examples, "A and B are connected" is defined to mean either (1) A and B are in direct contact with each other or (2) A and B are in contact with each other with a conductor film interposed therebetween (A and B are in contact with a top surface and a back surface of the conductor film, respectively). Further, "A and B are electrically connected" is defined to means that A and B may not need to be in direct contact with each other and include a case where A and B are indirectly connected via conductive wiring.

Note that, in the following working example and modified examples, with regard to A, B, and C mounted on a board, "C is arranged between A and B in the plan view of the board (or a principal surface of the board)" is defined to mean that at least part of a projected area of C in the plan view of the board overlaps a line connecting an arbitrary point in a projected area of A in the plan view of the board and an arbitrary point in a projected area of B in the plan view of the board.

EMBODIMENT

1. Circuit Configuration of Radio Frequency Module 1 and Communication Device 8

FIG. 1 is a circuit configuration diagram of a radio frequency module 1 and a communication device 8 according to an embodiment. As illustrated in FIG. 1, the communication device 8 includes the radio frequency module 1, an antenna element 5, a RF signal processing circuit (RFIC) 6, and a base band signal processing circuit (BBIC) 7.

The RFIC 6 is an RF signal processing circuit that performs processing on radio frequency signals to be transmitted from and received by the antenna element 5. Specifically, the RFIC 6 performs signal processing on a radio frequency reception signal input via a reception signal path of the radio frequency module 1 (path made up of a reception filter 22, a LNA 21, and a reception output terminal 120) using down-converting and the like, and outputs a reception signal generated by this signal processing to the BBIC 7. Further, the RFIC 6 performs signal processing on a transmission signal input from the BBIC 7 using up-converting and the like, and outputs a radio frequency transmission signal generated by this signal processing to a transmission signal path of the radio frequency module 1 (path made up of a transmission input terminal 110, a PA 11, and a transmission filter 12).

The BBIC 7 is a circuit that performs signal processing using an intermediate frequency band, which is lower in frequency than a radio frequency signal being transmitted through the radio frequency module 1. The signal processed in BBIC 7 is used as, for example, an image signal for image display or an audio signal for calling through a speaker.

The antenna element 5 is connected to a common terminal 100 of the radio frequency module 1, radiates a radio frequency signal output from the radio frequency module 1, and receives a radio frequency signal from outside and outputs the received radio frequency signal to the radio frequency module 1.

Note that in the communication device 8 according to the present embodiment, the antenna element 5 and the BBIC 7 are not essential constituent elements.

Next, the configuration of the radio frequency module 1 is described.

As illustrated in FIG. 1, the radio frequency module 1 includes the common terminal 100, the transmission input terminal 110, the reception output terminal 120, the PA (power amplifier) 11, the LNA (low noise amplifier) 21, the transmission filter 12, the reception filter 22, a transmission matching circuit 13, and a reception matching circuit 23.

The common terminal 100 is connected to the antenna element 5.

The transmission filter 12 is arranged in a transmission path connecting the PA 11 and the common terminal 100 and allows, of radio frequency transmission signals amplified by the PA 11, a radio frequency transmission signal in a transmission band of a first communication band to pass.

The reception filter 22 is arranged in a reception path connecting the LNA 21 and the common terminal 100 and allows, of radio frequency reception signals input from the common terminal 100, a radio frequency reception signal in a reception band of the first communication band to pass.

In the present embodiment, the transmission filter 12 and the reception filter 22 make up a duplexer capable of simultaneously transmitting and receiving radio frequency signals in the first communication band. Therefore, an output terminal of the transmission filter 12 and the common terminal 100 are connected, and an input terminal of the reception filter 22 and the common terminal 100 are connected. Note that a circuit element such as a switch may be arranged between the transmission filter 12 and the common terminal 100 and between the reception filter 22 and the common terminal 100. In this case, a radio frequency transmission signal and a radio frequency reception signal are subjected to processing in a time-division manner.

The transmission filter 12 and the reception filter 22 may each be, for example, any one of a surface acoustic wave filter, an acoustic wave filter using a bulk acoustic wave (BAW), a LC resonance filter, and a dielectric filter, but are not limited thereto.

The PA 11 is, for example, a transmission power amplifier that preferentially amplifies a radio frequency signal in the first communication band.

The LNA 21 is, for example, a reception low noise amplifier that preferentially amplifies a radio frequency signal in the first communication band with less noise.

The PA 11 and the LNA 21 are each made up of, for example, a field-effect transistor (FET), a heterojunction bipolar transistor (HBT), or the like, which use complementary metal oxide semiconductor (CMOS) or GaAs as a material.

The transmission matching circuit 13 is a circuit that provides matching between the output impedance of the PA 11 and the input impedance of the transmission filter 12 and is arranged in a path connecting an output port of the PA 11 and an input terminal of the transmission filter 12. The transmission matching circuit 13 is, for example, made up of passive elements such as an inductor, a capacitor, and the like. Note that the transmission matching circuit 13 may be arranged in the foregoing path in series or may be arranged between a node in the foregoing path and ground.

The reception matching circuit 23 is a circuit that provides matching between the output impedance of the reception filter 22 and the input impedance of the LNA 21 and is arranged in a path connecting an output terminal of the reception filter 22 and an input port of the LNA 21. The reception matching circuit 23 is, for example, made up of passive elements such as an inductor, a capacitor, and the like. Note that the reception matching circuit 23 may be arranged in the foregoing path in series or may be arranged between a node in the foregoing path and ground.

Note that the PA 11, the LNA 21, the transmission matching circuit 13, and the reception matching circuit 23 are not essential constituent elements of a radio frequency module according to the present disclosure. Note that in this case, the radio frequency module 1 serves as a module that transmits and receives a radio frequency signal using a duplexer.

Alternatively, the radio frequency module 1 according to the present embodiment may be a circuit that not only transmits a radio frequency signal of the first communication band but transmits radio frequency signals of a plurality of communication bands. In this case, the radio frequency module 1 forms a circuit that additionally includes a transmission power amplifier and a reception low noise amplifier that each amplify a radio frequency signal of a communication band other than the first communication band, a transmission filter and a reception filter whose pass bands are communication bands other than the first communication band, and switches that switch between a plurality of the transmission power amplifiers, between a plurality of the reception low noise amplifiers, between a plurality of the transmission filters, and between a plurality of the reception filters.

In the following, configurations of the radio frequency module 1 according to the present embodiment for realizing downsizing and reduction of transmission loss are described.

2. Circuit Element Arrangement Configuration of Radio Frequency Module 1A According to Working Example 1

Figure 2A:
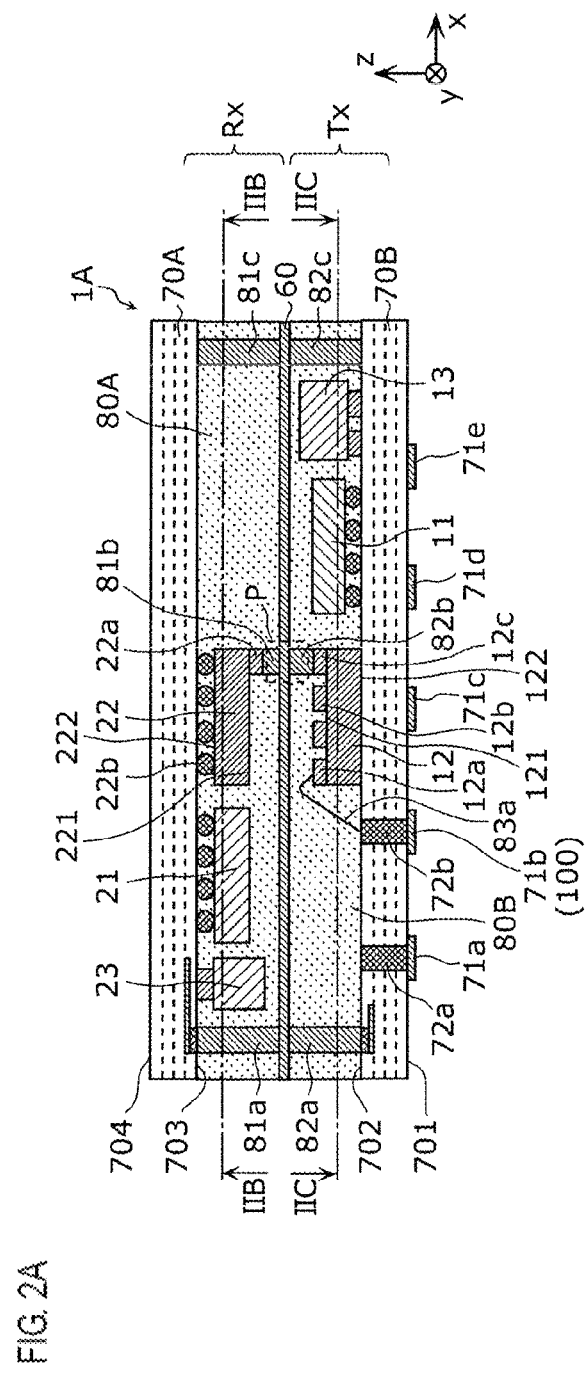
FIG. 2A is a schematic cross-sectional configuration diagram of a radio frequency module according to a working example 1.
Figure 2B:
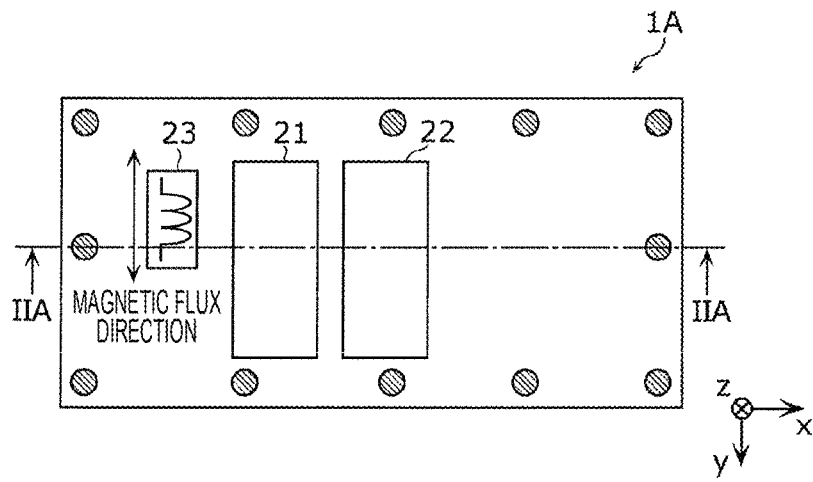
FIG. 2B is a schematic first plane configuration diagram of the radio frequency module according to the working example 1.
Figure 2C:
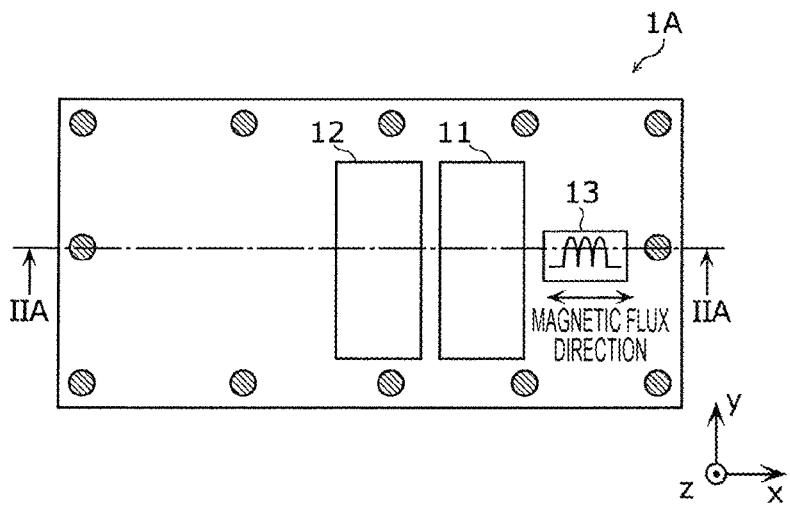
FIG. 2C is a schematic second plane configuration diagram of the radio frequency module according to the working example 1.

FIG. 2A is a schematic cross-sectional configuration diagram of a radio frequency module 1A according to a working example 1. FIG. 2B is a schematic first plane configuration diagram of the radio frequency module 1A according to the working example 1. FIG. 2C is a schematic second plane configuration diagram of the radio frequency module 1A according to the working example 1. Specifically, FIG. 2A is a cross-sectional diagram along line IIA-IIA in FIG. 2B and FIG. 2C. FIG. 2B is a cross-sectional diagram along line IIB-IIB in FIG. 2A, and FIG. 2C is a cross-sectional diagram along line IIC-IIC in FIG. 2A.

The radio frequency module 1A according to the working example 1 illustrated in FIG. 2A to FIG. 2C is a structural example in which the circuit configuration of the radio frequency module 1 according to the embodiment described above is realized in a single module.

As illustrated in FIG. 2A, the radio frequency module 1A according to the present working example further includes, in addition to the circuit configuration of the radio frequency module 1 illustrated in FIG. 1, module boards 70A and 70B and resin members 80A and 80B.

The radio frequency module 1A according to the present working example is connected to an external board (mother board). Of the module boards 70A and 70B, on the module board 70B side (z-axis negative direction side), the foregoing external board is arranged in such a manner as to be opposite the module board 70B.

The module board 70B is a first mounting board that has a principal surface 701 (first principal surface) and a principal surface 702 (second principal surface) that are opposite each other.

The module board 70A is a second mounting board that has a principal surface 703 (third principal surface) and a principal surface 704 (fourth principal surface) that are opposite each other, in which the principal surface 703 faces the principal surface 702.

Note that as the module boards 70A and 70B, for example, a low temperature co-fired ceramics (LTCC) board having a multilayer structure made up of a plurality of dielectric layers, a printed board, or the like is used.

The transmission filter 12 has a mounting surface 122 (first mounting surface) and a top surface 121 (first top surface) that are opposite each other and is arranged in an inner space formed between the module board 70A and the module board 70B. Further, the mounting surface 122 is joined to the principal surface 702 with a metal electrode layer interposed therebetween. In other words, the transmission filter 12 is mounted in such a way that the mounting surface 122 faces the principal surface 702. An output terminal 12c of the transmission filter 12 is arranged on the top surface 121. Alternatively, the transmission filter 12 may be connected to the principal surface 702 with bump electrodes interposed therebetween, and the bump electrodes are formed on the mounting surface 122.

The reception filter 22 has a mounting surface 222 (second mounting surface) and a top surface 221 (second top surface) that are opposite each other and is arranged in the foregoing inner space. Further, the mounting surface 222 is mounted on the principal surface 703 with bump electrodes interposed therebetween. In other words, the reception filter 22 is mounted in such a way that the mounting surface 222 faces the principal surface 703. Note that the medium for connecting the mounting surface 222 and the principal surface 703 does not need to be a bump electrode and may alternatively be a metal electrode layer. An input terminal 22a of the reception filter 22 is arranged on the top surface 221.

The common terminal 100 is an external connection terminal 71b arranged on the principal surface 701 of the module board 70B.

As illustrated in FIG. 2B and FIG. 2C, when the module boards 70A and 70B are seen in a plan view, a footprint of the transmission filter 12 and a footprint of the reception filter 22 at least partially overlap.

As illustrated in FIG. 2A, the radio frequency module 1A further includes connection electrodes 81b and 82b that connect the output terminal 12c of the transmission filter 12 and the input terminal 22a of the reception filter 22 and an anisotropic conductive film 60. The connection electrodes 81b and 82b and the anisotropic conductive film 60 are arranged in an inner space formed between the module board 70A and the module board 70B and are all conductive members that are not routed through the module board 70A or 70B (principal surface 702 or 703).

The radio frequency module 1A having the foregoing configuration has a configuration in which the transmission filter 12 and the reception filter 22 are divided and mounted in the inner space formed between the two module boards 70A and 70B, which are opposite each other, in such a way that the transmission filter 12 and the reception filter 22 are arranged opposite each other and partially overlap with each other in the foregoing plan view and that the output terminal 12c of the transmission filter 12 and the input terminal 22a of the reception filter 22 are electrically connected to the common terminal 100. This enables to reduce the area of the radio frequency module 1A. Further, the output terminal 12c and the input terminal 22a are connected on the respective top surfaces with the conductive members, which are not routed through the module board 70A or 70B, interposed therebetween. That is to say, the wiring connecting the output terminal 12c and the input terminal 22a can be connected in the foregoing inner space in a short distance without being routed through the module board 70A or 70B. This enables to shorten the sum of wiring lengths of the connection wiring between the common terminal 100 and the output terminal 12c of the transmission filter 12 and the connection wiring between the common terminal 100 and the input terminal 22a of the reception filter 22. Accordingly, it becomes possible to reduce the transmission loss of a radio frequency signal while downsizing the radio frequency module 1A. Further, it becomes possible to dissipate heat generated in the transmission filter 12 not only from the module board 70B on which the transmission filter 12 is mounted but also from the module board 70A via the foregoing conductive members (connection electrodes 81b and 82b and anisotropic conductive film 60) and the reception filter 22. Therefore, the heat dissipation property of the transmission filter 12 is improved.

The configuration of the radio frequency module 1A is described below in detail.

The connection electrode 81b has two connection surfaces for external connection. One of the connection surfaces is connected to the input terminal 22a, and the other connection surface is connected to the anisotropic conductive film 60. Further, a hypothetical line connecting these two connection surfaces is substantially parallel to the direction vertical to the principal surface 703.

The connection electrode 82b has two connection surfaces for external connection. One of the connection surfaces is connected to the output terminal 12c, and the other connection surface is connected to the anisotropic conductive film 60. Further, a hypothetical line connecting these two connection surfaces is substantially parallel to the direction vertical to the principal surface 702.

It is desirable that the connection electrodes 81b and 82b are a metal such as Cu, Ag, or the like in consideration of heat dissipation property and electrical conductivity.

Further, the conductive members that connect the output terminal 12c of the transmission filter 12 and the input terminal 22a of the reception filter 22 include the anisotropic conductive film 60 in addition to the connection electrodes 81b and 82b. The anisotropic conductive film 60 is an anisotropic conductive member that is preferentially conductive in the direction vertical to the principal surfaces 702 and 703 compared with the direction parallel to the principal surfaces 702 and 703 and is arranged between the top surface 121 of the transmission filter 12 and the top surface 221 of the reception filter 22.

According to the connection electrodes 81b and 82b and the anisotropic conductive film 60 that have configurations such as described above, the wiring connecting the output terminal 12c of the transmission filter 12 and the input terminal 22a of the reception filter 22 can be formed only using components along the direction vertical to the principal surfaces of the module boards 70A and 70B. Therefore, the wiring can be connected in the shortest distance in the foregoing inner space. This enables to minimize the sum of wiring lengths of the connection wiring between the common terminal 100 and the output terminal 12c of the transmission filter 12 and the connection wiring between the common terminal 100 and the input terminal 22a of the reception filter 22.

Figure 3:
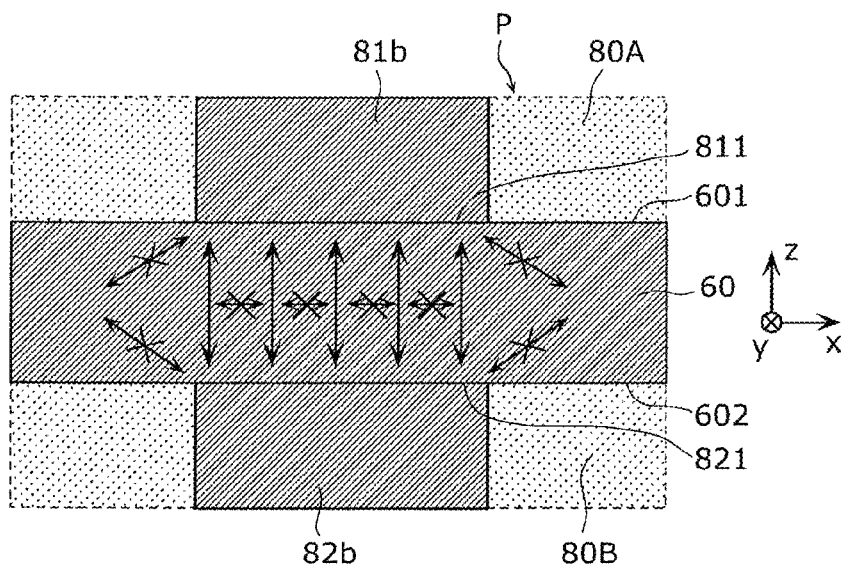
FIG. 3 is a schematic expanded cross-sectional diagram for illustrating conductive characteristics of an anisotropic conductive film.

FIG. 3 is a schematic expanded cross-sectional diagram for illustrating conductive characteristics of the anisotropic conductive film 60. FIG. 3 illustrates an expanded cross-sectional diagram of the anisotropic conductive film 60, the connection electrodes 81b and 82b, and resin members 80A and 80B in an area P of the inner space illustrated in FIG. 2A.

As illustrated in FIG. 3, the other connection surface 811 of the connection electrode 81b is joined to a surface 601 of the anisotropic conductive film 60, and the other connection surface 821 of the connection electrode 82b is joined to a surface 602 of the anisotropic conductive film 60. Here, in an area between the connection electrodes 81b and 82b, the anisotropic conductive film 60 is preferentially conductive in the direction connecting the connection electrode 81b and the connection electrode 82b (z-axis direction). Whereas the anisotropic conductive film 60 is substantially non-conductive in the direction parallel to the film surface of the anisotropic conductive film 60 (x-axis direction and y-axis direction).

By using the anisotropic conductive film 60 as a conductive member for connecting the transmission filter 12 and the reception filter 22, in fabrication steps of the radio frequency module 1A, the module board 70B on which the transmission filter 12 is mounted and the module board 70A on which the reception filter 22 is mounted can be joined easily and highly accurately with the anisotropic conductive member interposed therebetween. Accordingly, using simplified fabrication steps, the output terminal 12c of the transmission filter 12 and the input terminal 22a of the reception filter 22 can be connected with a high degree of accuracy.

Note that specific fabrication steps of the radio frequency module 1A in which the anisotropic conductive film 60 is used will be described later.

Further, as illustrated in FIG. 2A, in the radio frequency module 1A according to the present working example, the input terminal 12b and a common output terminal 12a of the transmission filter 12 are each arranged on the top surface 121. Note that the common output terminal 12a is a terminal that lies between the output terminal 12c and the common terminal 100 (external connection terminal 71b) and is electrically connected to the output terminal 12c of the transmission filter 12 inside the transmission filter 12. In FIG. 2A, the common output terminal 12a and the output terminal 12c are illustrated as separate terminals. Alternatively, the common output terminal 12a and the output terminal 12c may form a single terminal on the top surface 121. In such case, the terminal formed by uniting the common output terminal 12a and the output terminal 12c has, on the top surface 121, an area to which the connection electrode 82b is joined and an area to which a bonding wire 83a is joined. Further, an output terminal 22b of the reception filter 22 is arranged on the mounting surface 222.

The common terminal 100 (external connection terminal 71b) and the common output terminal 12a are connected by a via conductor 72b and the bonding wire 83a. The via conductor 72b is a first via conductor that penetrates through the module board 70B and is connected to the common terminal 100 (external connection terminal 71b) at one end portion and to the bonding wire 83a at the other end portion. The bonding wire 83a is connected to the other end portion of the via conductor 72b and the common output terminal 12a.

The foregoing configuration enables to shorten the length of the wiring connecting the output terminal 12c of the transmission filter 12 and the common terminal 100 (external connection terminal 71b). Therefore, particularly, the transmission loss of a radio frequency transmission signal can be reduced. Further, the heat generated in the transmission filter 12 can be preferentially dissipated from the module board 70B on which the foregoing wiring is formed. Therefore, the heat dissipation property of the transmission filter 12 is improved.

Further, in the present working example, as illustrated in FIG. 2A, the PA 11 is mounted on the principal surface 702, the LNA 21 is mounted on the principal surface 703, and a footprint of the PA 11 does not overlap with a footprint of the LNA 21 do not overlap when the module boards 70A and 70B are seen in a plan view.

This enables to hinder the heat generated in the PA 11 from being transmitted to the LNA 21 and enables the suppression of characteristic variations of the LNA 21 caused by the foregoing generated heat.

Further, in the present working example, as illustrated in FIG. 2A to FIG. 2C, when the module boards 70A and 70B are seen in a plan view, the transmission filter 12, the reception filter 22, the PA 11, and the LNA 21 are arranged between the transmission matching circuit 13 and the reception matching circuit 23.

This enables to suppress electromagnetic coupling between the transmission matching circuit 13 and the reception matching circuit 23. Accordingly, it becomes possible to reduce the amount of inflow of harmonic wave components of a high-power radio frequency transmission signal amplified by the PA 11 and intermodulation distortion components into the reception filter 22 and the LNA 21. Therefore, degradation of reception sensitivity of the radio frequency module 1A can be suppressed.

Note that at least one of the transmission filter 12, the reception filter 22, the PA 11, and the LNA 21 may be arranged in between the transmission matching circuit 13 and the reception matching circuit 23.

Further, as illustrated in FIG. 2B and FIG. 2C, in the case where the transmission matching circuit 13 includes a first inductor and the reception matching circuit 23 includes a second inductor, it is desirable that the magnetic flux direction (direction of coil winding axis) of the first inductor and the magnetic flux direction (direction of coil winding axis) of the second inductor cross each other. This enables to further suppress magnetic coupling between the transmission matching circuit 13 and the reception matching circuit 23.

The resin member 80A is formed in the foregoing inner space and covers the reception filter 22, the LNA 21, and the reception matching circuit 23. The resin member 80B is formed in the foregoing inner space and covers the transmission filter 12, the PA 11, and the transmission matching circuit 13. For the resin members 80A and 80B, a resin material such as, for example, epoxy resin or the like can be used. The resin members 80A and 80B enable to ensure reliability, such as mechanical strength, moisture resistance, and the like, of the reception filter 22, the LNA 21, the reception matching circuit 23, the transmission filter 12, the PA 11, and the transmission matching circuit 13. Note that the resin member 80A only needs to cover at least part of the reception filter 22, the LNA 21, and the reception matching circuit 23, and the resin member 80B only needs to cover at least part of the transmission filter 12, the PA 11, and the transmission matching circuit 13. Further, the resin members 80A and 80B are not essential constituent elements of a radio frequency module according to the present disclosure.

The radio frequency module 1A according to the present embodiment further includes external connection terminals 71a, 71b, 71c, 71d, and 71e arranged on the principal surface 701 of the module board 70B, a via conductor 72a, and columnar electrodes 81a, 82a, 81c, and 82c. The external connection terminals 71a to 71e are each connected to an external board for transmitting a radio frequency signal, a direct-current voltage, or the like, or for setting at a ground potential of an external board. The columnar electrodes 81a and 81c are each connected to an electrode formed on the module board 70A for transmitting a radio frequency signal, a direct-current voltage, or the like, or for setting at the ground potential. The columnar electrodes 82a and 82c are each connected to an electrode formed on the module board 70B for transmitting a radio frequency signal, a direct-current voltage, or the like, or for setting at the ground potential. Note that the external connection terminals 71a to 71e, the via conductor 72a, and the columnar electrodes 81a, 82a, 81c, and 82c are not essential constituent elements of a radio frequency module according to the present disclosure.

3. Fabrication Method of Radio Frequency Module 1A According to Working Example 1

Here, a fabrication method of the radio frequency module 1A according to the working example 1 is described.

First, a collective board A including a plurality of module boards 70A and a collective board B including a plurality of module boards 70B are prepared. Subsequently, a plurality of the reception filters 22, a plurality of the LNAs 21, and a plurality of the reception matching circuits 23 are mounted on the collective board A (the principal surface 703 of the module board 70A). Further, a plurality of the transmission filters 12, a plurality of the PAs 11, and a plurality of the transmission matching circuits 13 are mounted on the collective board B (the principal surface 702 of the module board 70B) (Step 1). At this time, the input terminal 22a and the connection electrode 81b are joined to the top surface 221 of the reception filter 22 in advance, and the output terminal 12c, the connection electrode 82b, the input terminal 12b, and the common output terminal 12a are joined to the top surface 121 of the transmission filter 12 in advance.

Next, a seal material, which becomes the resin member 80A, is applied in such a manner as to cover the collective board A (the principal surface 703 of the module board 70A, the reception filter 22, the LNA 21, and the reception matching circuit 23), and then the collective board A covered with the seal material is subjected to heating and curing. Further, a seal material, which becomes the resin member 80B, is applied in such a manner as to cover the collective board B (the principal surface 702 of the module board 70B, the transmission filter 12, the PA 11, and the transmission matching circuit 13), and then the collective board B covered with the seal material is subjected to heating and curing (Step 2).

Next, surfaces of the seal material that forms the resin member 80A and the seal material that forms the resin member 80B are planarized, and then the surfaces of the seal materials are polished (and ground) to expose the connection electrodes 81b and 82b to the surface (Step 3).

Next, for example, an anisotropic conductive paste is uniformly applied on the polished surface of the seal material. Note that in the case where an anisotropic conductive paste is not used, an electrically conductive adhesive may be applied to locations where conductive connection is needed between two blocks (parts to which the connection electrodes 81*b* and 82*b* are joined and other similar parts), and an electrically non-conductive adhesive may be applied to the other parts (Step 4).

Next, a block including the collective board A (the module board 70A and the resin member 80A) and a block including the collective board B (the module board 70B and the resin member 80B) are pasted together after adjusting the position, and the attached blocks are heated for curing of the anisotropic conductive paste (Step 5).

Lastly, a block formed by pasting the collective board A and the collective board B together is cut into individual pieces with a dicing machine or the like to produce individual modules (sub boards) (Step 6).

According to the foregoing fabrication steps, it becomes possible to separately fabricate a block including the module board 70A on which reception system components are mounted and a block including the module board 70B on which transmission system components are mounted up to an intermediate step of the fabrication. Further, after that step, by using the anisotropic conductive paste, without requiring excessive accuracy in positioning of the connection electrodes 81*b* and 82*b*, it becomes possible to fabricate the radio frequency module 1A with a high degree of accuracy using simplified steps.

Note that from the viewpoint of the foregoing fabrication steps, the thickness of the resin member 80A in the direction vertical to the principal surface 703 (z-axis direction) may be different from the thickness of the resin member 80B in the direction vertical to the principal surface 702 (z-axis direction). By making the thicknesses of the resin members 80A and 80B different from each other, the contraction stress generated during heating and curing of the seal material can be varied between the block including the module board 70A and the resin member 80A and the block including the module board 70B and the resin member 80B. This enables to achieve a balance in the contraction stress by reducing the amount of the seal material in the block whose warping amount is greater and to suppress the warping of the radio frequency module 1A.

Further, the material of the resin member 80A may be different from the material of the resin member 80B. Because of this, for example, a resin material having a smaller contraction amount is used for the block whose warping amount is greater. Alternatively, in addition to changing the resin material, the thickness of the seal material may also be varied as described above. By doing so, the warping of the radio frequency module 1A can be suppressed accurately.

4. Configurations of Radio Frequency Module According to Modified Examples

Figure 4:
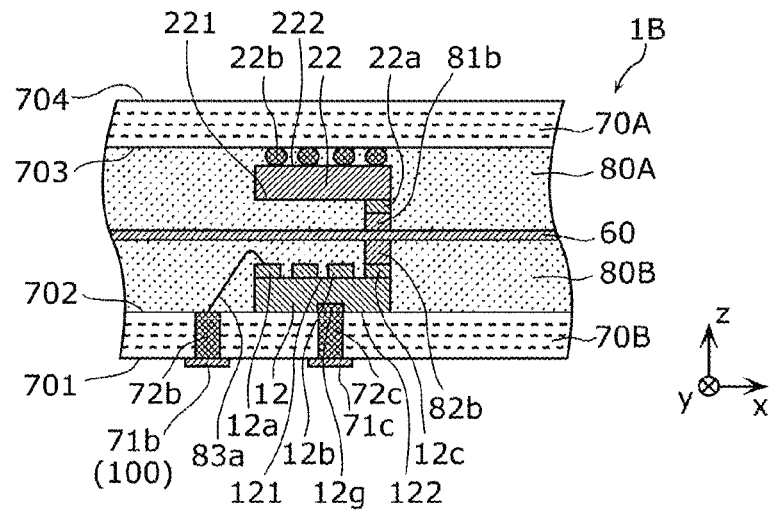
FIG. 4 is a schematic cross-sectional configuration diagram of a radio frequency module according to a modified example 1 of the embodiment.

FIG. 4 is a schematic cross-sectional configuration diagram of a radio frequency module 1B according to a modified example 1 of the embodiment. The radio frequency module 1B according to the present modified example is different from the radio frequency module 1A according to the working example 1 only in that the configuration of ground wiring of the transmission filter 12 is indicated. Note that FIG. 4 is illustrated with a focus on constituent components of the transmission filter 12 that are different from the radio frequency module 1A according to the working example 1. Hereinafter, the radio frequency module 1B according to the present modified example is described with the emphasis on points different from the radio frequency module 1A according to the working example 1 while omitting the description regarding the same points.

The transmission filter 12 has the mounting surface 122 (first mounting surface) and the top surface 121 (first top surface) that are opposite each other and is arranged in the inner space formed between the module board 70A and the module board 70B. Further, the transmission filter 12 is mounted in such a way that the mounting surface 122 faces the principal surface 702. The output terminal 12*c* of the transmission filter 12 is arranged on the top surface 121. Alternatively, the transmission filter 12 may be connected to the principal surface 702 with bump electrodes, which are formed on the mounting surface 122, interposed therebetween.

As illustrated in FIG. 4, the radio frequency module 1B further includes connection electrodes 81*b* and 82*b* that connect the output terminal 12*c* of the transmission filter 12 and the input terminal 22*a* of the reception filter 22 and the anisotropic conductive film 60. The connection electrodes 81*b* and 82*b* and the anisotropic conductive film 60 are arranged in the inner space formed between the module board 70A and module board 70B and are all conductive members that are not routed through the module board 70A or 70B (principal surface 702 or 703).

Because of this, the wiring for connecting the output terminal 12*c* and the input terminal 22*a* can be connected in a short distance in the foregoing inner space without being routed through the module boards 70A or 70B. This enables to shorten the sum of wiring lengths of the connection wiring between the common terminal 100 and the output terminal 12*c* of the transmission filter 12 and the connection wiring between the common terminal 100 and the input terminal 22*a* of the reception filter 22. Accordingly, it becomes possible to reduce the transmission loss of a radio frequency signal while downsizing the radio frequency module 1B.

Further, it becomes possible to dissipate heat generated in the transmission filter 12 not only from the module board 70B on which the transmission filter 12 is mounted but also from the module board 70A via the foregoing conductive members and the reception filter 22. Therefore, the heat dissipation property of the transmission filter 12 is improved.

Further, as illustrated in FIG. 4, in the radio frequency module 1B according to the present modified example, the input terminal 12*b* and the common output terminal 12*a* of the transmission filter 12 are each arranged on the top surface 121. Whereas a ground terminal 12*g* of the transmission filter 12 is arranged on the mounting surface 122.

The common terminal 100 (external connection terminal 71*b*) and the common output terminal 12*a* are connected by the via conductor 72*b* and the bonding wire 83*a*. The bonding wire 83*a* is connected to the other end portion of the via conductor 72*b* and the common output terminal 12*a*.

The foregoing configuration enables to shorten the wiring connecting the output terminal 12*c* of the transmission filter 12 and the common terminal 100 (external connection terminal 71*b*). Therefore, in particular, the transmission loss of a radio frequency transmission signal can be reduced. Further, the heat generated in the transmission filter 12 can be preferentially dissipated from the module board 70B on which the foregoing wiring is formed. Therefore, the heat dissipation property of the transmission filter 12 is improved.

Further, the ground terminal 12*g* of the transmission filter 12 is connected to one end portion of a via conductor 72*c*. The other end portion of the via conductor 72*c* is connected to an external connection terminal 71*c* arranged on the principal surface 701 of the module board 70B. The via conductor 72c is a second via conductor that penetrates through the module board 70B.

This enables to dissipate the heat generated in the transmission filter 12 also from the module board 70B via the ground wiring (the ground terminal 12g+the via conductor 72c+the external connection terminal 71c). Therefore, the heat dissipation property of the transmission filter 12 is further improved.

Figure 5:
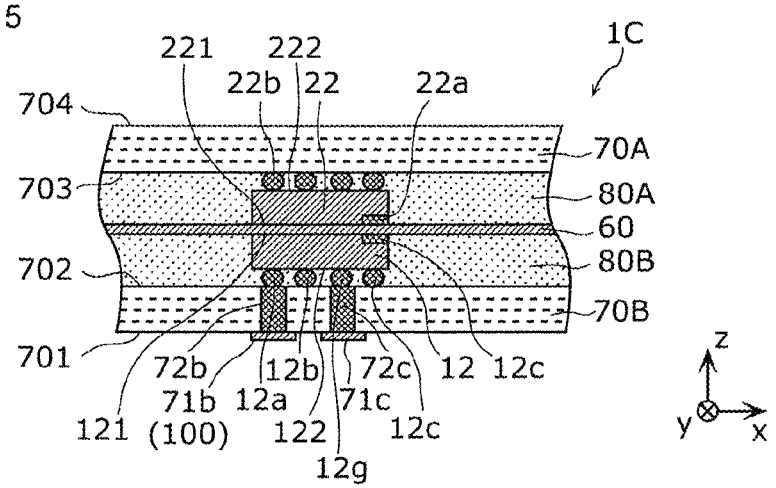
FIG. 5 is a schematic cross-sectional configuration diagram of a radio frequency module according to a modified example 2 of the embodiment.

FIG. 5 is a schematic cross-sectional configuration diagram of a radio frequency module 1C according to a modified example 2 of the embodiment. The radio frequency module 1C according to the present modified example is different from the radio frequency module 1A according to the working example 1 in the configuration of ground wiring of the transmission filter 12, the connection configuration between the common terminal 100 and the transmission filter 12, and the connection configuration between the transmission filter 12 and the reception filter 22. Note that the illustration of FIG. 5 focuses on constituent components of the transmission filter 12 and the reception filter 22 that are different from those of the radio frequency module 1A according to the working example 1. Hereinafter, the radio frequency module 1C according to the present modified example is described with the emphasis on points different from the radio frequency module 1A according to the working example 1 while omitting the description regarding the same points.

The transmission filter 12 has the mounting surface 122 (first mounting surface) and the top surface 121 (first top surface) that are opposite each other and is arranged in the inner space formed between the module board 70A and the module board 70B. Further, the mounting surface 122 is mounted on the principal surface 702 with bump electrodes interposed therebetween. Note that the medium for connecting the mounting surface 122 and the principal surface 702 does not need to be the bump electrodes and may alternatively be a metal electrode layer. The output terminal 12c of the transmission filter 12 is arranged on the top surface 121. Further, the input terminal 12b, the common output terminal 12a, and the ground terminal 12g of the transmission filter 12 are each arranged on the mounting surface 122.

The reception filter 22 has a mounting surface 222 (second mounting surface) and a top surface 221 (second top surface) that are opposite each other and is arranged in the foregoing inner space. Further, the mounting surface 222 is mounted on the principal surface 703 with bump electrodes interposed therebetween. Further, the input terminal 22a of the reception filter 22 is arranged on the top surface 221. Note that the medium for connecting the mounting surface 222 and the principal surface 703 does not need to be the bump electrodes and may alternatively be a metal electrode layer.

The common terminal 100 is the external connection terminal 71b arranged on the principal surface 701 of the module board 70B.

As illustrated in FIG. 5, the radio frequency module 1C further includes the anisotropic conductive film 60 that connects the output terminal 12c of the transmission filter 12 and the input terminal 22a of the reception filter 22. The anisotropic conductive film 60 is a conductive member that is not routed through the principal surface 702 or 703 and is arranged in the inner space formed between the module board 70A and module board 70B.

Because of this, the wiring connecting the output terminal 12c of the transmission filter 12 and the input terminal 22a of the reception filter 22 includes substantially only the anisotropic conductive film 60. Therefore, it becomes possible to connect the output terminal 12c and the input terminal 22a in a short distance in the foregoing inner space.

Further, the common terminal 100 (external connection terminal 71b) and the common output terminal 12a are connected by the via conductor 72b. The via conductor 72b is a third via conductor that penetrates through the module board 70B.

This enables the output terminal 12c of the transmission filter 12 and the common terminal 100 to be connected to each other with the via conductor 72b interposed therebetween using no bonding wire. Therefore, the transmission loss of a radio frequency transmission signal can be reduced. Further, the heat generated in the transmission filter 12 can be preferentially dissipated from the module board 70B in which the via conductor 72b is formed. Therefore, the heat dissipation property of the transmission filter 12 is improved.

Further, the ground terminal 12g of the transmission filter 12 is connected to one end portion of the via conductor 72c. The other end portion of the via conductor 72c is connected to the external connection terminal 71c arranged on the principal surface 701 of the module board 70B. The via conductor 72c is the second via conductor that penetrates through the module board 70B.

This enables to dissipate the heat generated in the transmission filter 12 also from the module board 70B via the ground wiring (the ground terminal 12g+the via conductor 72c+the external connection terminal 71c). Therefore, the heat dissipation property of the transmission filter 12 is further improved.

Note that with regard to fabrication steps of the radio frequency module 1C according to the present modified example, steps different from the radio frequency module 1A are described. Of the fabrication steps of the radio frequency module 1A described above, in the step 3, at the time of planarizing the surfaces of the seal material that forms the resin member 80A and the seal material that forms the resin member 80B, the surfaces of the seal materials are polished and ground in such a manner as to expose the top surface 121 of the transmission filter 12 and the top surface 221 of the reception filter 22 to the surface. For example, in the case where the transmission filter 12 and the reception filter 22 are SAW filters, a top surface of a piezoelectric board is exposed to the foregoing surface.

This enables to directly transmit the heat generated in the transmission filter 12 to the reception filter 22. Therefore, the heat dissipation property is improved. Further, the top surfaces of the piezoelectric boards are attached together. Therefore, the contact area thereof becomes greater, and the heat dissipation property is further improved. Further, as in the step 4, by using an anisotropic conductive film at a part where the top surfaces of the transmission filter 12 and the reception filter 22 are attached together, thermal conduction efficiency at a joint part is improved. Therefore, the heat dissipation property can be further improved.

Figure 6:
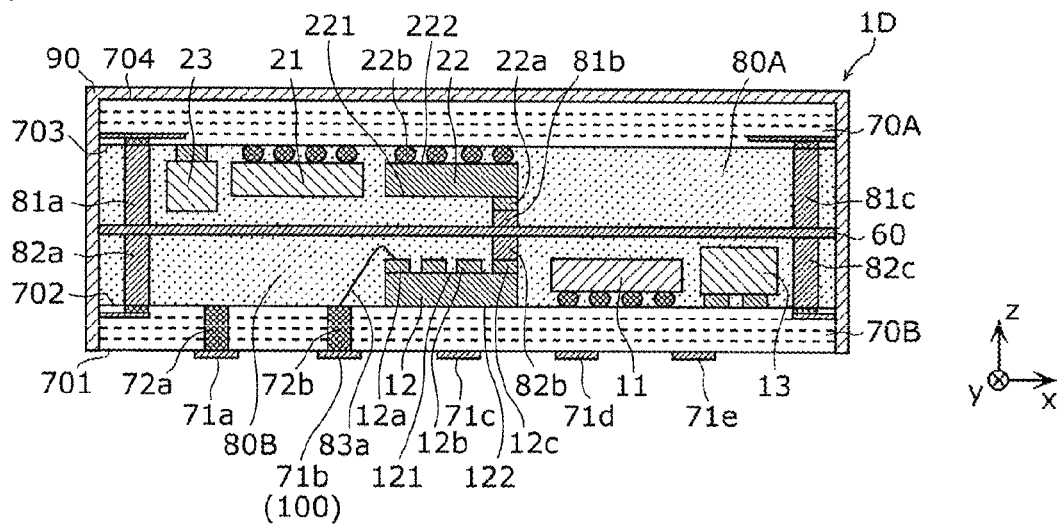
FIG. 6 is a schematic cross-sectional configuration diagram of a radio frequency module according to a modified example 3 of the embodiment.

FIG. 6 is a schematic cross-sectional configuration diagram of a radio frequency module 1D according to a modified example 3 of the embodiment. The radio frequency module 1D according to the present modified example is different from the radio frequency module 1A according to the working example 1 in that a shield electrode layer is added. Hereinafter, the radio frequency module 1D according to the present modified example is described with the emphasis on points different from the radio frequency module 1A according to the working example 1 while omitting the description regarding the same points.

The radio frequency module 1D further includes, in addition to the constituent elements of the radio frequency module 1A, a shield electrode layer 90 and a ground electrode layer.

The foregoing ground electrode layer is an electrode that is made up of plane wiring patterns of the module boards 70A and 70B and is set at a ground potential.

The shield electrode layer 90 is formed in such a manner as to cover the principal surface 704 and is connected to the foregoing ground electrode layer on the side surfaces of the module boards 70A and 70B.

This enables to suppress the direct radiation of a transmission signal output from the PA 11 and the transmission filter 12 to outside from the radio frequency module 1D and further suppress the entry of external noise into the reception filter 22 and the LNA 21. Further, this enables to dissipate the heat generated in the transmission filter 12 via the shield electrode layer 90. Therefore, the heat dissipation property is improved.

Note that in the fabrication steps of the radio frequency module 1A described above, the shield electrode layer 90 is formed, for example, using sputtering, vacuum vapor deposition, or the like after cutting the collective board into individual pieces in the step 6. By forming the shield electrode layer 90 after the step 6, it becomes possible to further form the shield electrode layer 90 on the side surfaces of the module boards 70A and 70B, and this enables to connect the shield electrode layer 90 and the foregoing ground electrode layer in an electrically conductive manner.

Figure 7:
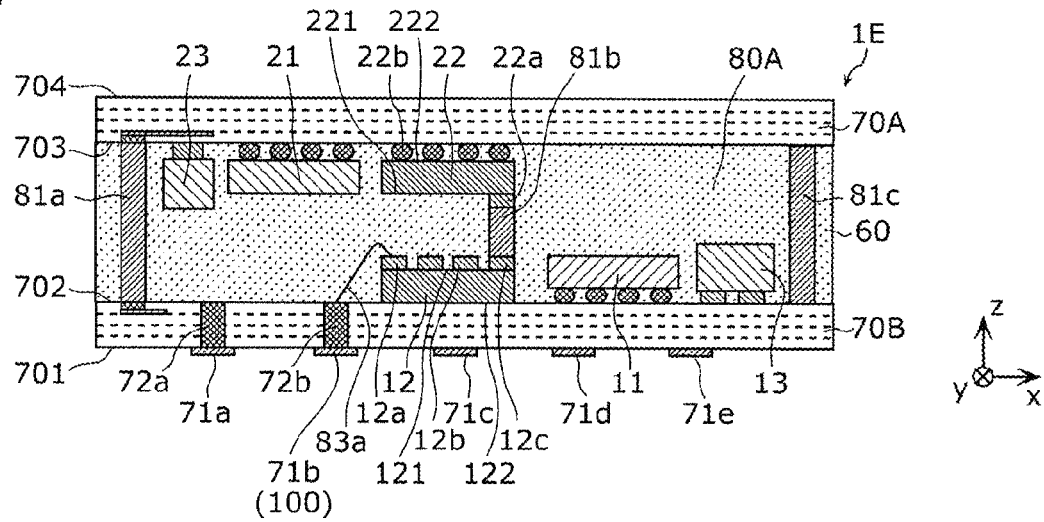
FIG. 7 is a schematic cross-sectional configuration diagram of a radio frequency module according to a modified example 4 of the embodiment.

FIG. 7 is a schematic cross-sectional configuration diagram of a radio frequency module 1E according to a modified example 4 of the embodiment. The radio frequency module 1E according to the present modified example is different from the radio frequency module 1A according to the working example 1 in that the anisotropic conductive film 60 is not placed. Hereinafter, the radio frequency module 1E according to the present modified example is described with the emphasis on points different from the radio frequency module 1A according to the working example 1 while omitting the description regarding the same points.

As illustrated in FIG. 7, the radio frequency module 1E includes the connection electrode 81b that connects the output terminal 12c of the transmission filter 12 and the input terminal 22a of the reception filter 22. The connection electrode 81b is a conductive member that is not routed through the module board 70A or 70B (principal surface 702 or 703) and is arranged in the inner space formed between the module board 70A and module board 70B.

That is to say, the radio frequency module 1E having the foregoing configuration includes: the module board 70B having the principal surfaces 701 and 702 that are opposite each other; the module board 70A having the principal surfaces 703 and 704 that are opposite each other, in which the principal surface 703 faces the principal surface 702; the transmission filter 12 that has the mounting surface 122 and the top surface 121 that are opposite each other, the transmission filter 12 being arranged in the foregoing inner space and being mounted in such a way that the mounting surface 122 faces the principal surface 702; the reception filter 22 that has the mounting surface 222 and the top surface 221 that are opposite each other, the reception filter 22 being arranged in the foregoing inner space and being mounted in such a way that the mounting surface 222 faces the principal surface 703; and the common terminal 100 (external connection terminal 71b) that is arranged on the principal surface 701 or 704 and is electrically connected to the output terminal 12c of the transmission filter 12 and the input terminal 22a of the reception filter 22. Here, in the foregoing plan view, the footprint of the transmission filter 12 at least partially overlaps with the footprint of the reception filter 22. The output terminal 12c is arranged on the top surface 121, and the input terminal 22a is arranged on the top surface 221. Further, the output terminal 12c and the input terminal 22a are arranged in the foregoing inner space and connected to each other using the connection electrode 81b that is not routed through the module board 70A or 70B.

This enables to reduce the area of the radio frequency module 1E. Further, the output terminal 12c and the input terminal 22a are connected on the respective top surfaces thereof with the conductive member (connection electrode 81b), which is not routed through the principal surface 702 or 703, interposed therebetween. That is to say, the wiring for connecting the output terminal 12c of the transmission filter 12 and the input terminal 22a of the reception filter 22 can be connected in a short distance in the foregoing inner space without being routed through the module boards 70A or 70B. This enables to shorten the sum of wiring lengths of the connection wiring between the common terminal 100 and the output terminal 12c of the transmission filter 12 and the connection wiring between the common terminal 100 and the input terminal 22a of the reception filter 22. Accordingly, it becomes possible to reduce the transmission loss of a radio frequency signal while downsizing the radio frequency module 1E. Further, it becomes possible to dissipate the heat generated in the transmission filter 12 not only from the module board 70B on which the transmission filter 12 is mounted but also from the module board 70A via the foregoing connection electrode 81b and the reception filter 22. Therefore, the heat dissipation property of the transmission filter 12 is improved.

Note that in the present modified example, the foregoing inner space is filled with a single kind of the resin member 80A. Alternatively, as in the case with the radio frequency module 1A according to the working example 1, the configuration may be such that the foregoing inner space is filled with two resin members 80A and 80B.

Figure 8:
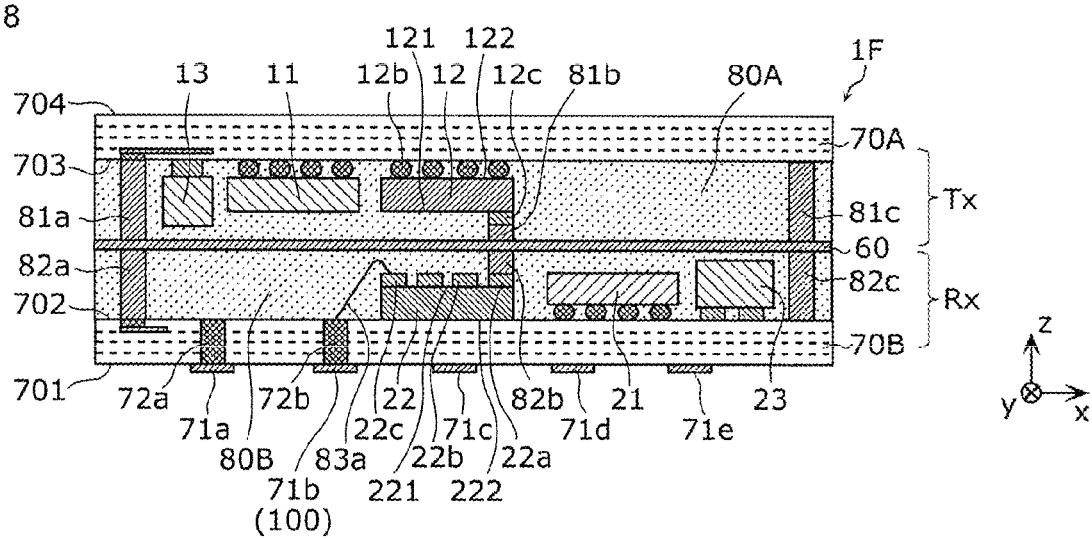
FIG. 8 is a schematic cross-sectional configuration diagram of a radio frequency module according to a modified example 5 of the embodiment.

FIG. 8 is a schematic cross-sectional configuration diagram of a radio frequency module 1F according to a modified example 5 of the embodiment. The radio frequency module 1F according to the present modified example is different from the radio frequency module 1A according to the working example 1 in that the positional relationship between the transmission system circuit elements and the reception system circuit elements are reversed in the vertical direction. Hereinafter, the radio frequency module 1F according to the present modified example is described with the emphasis on points different from the radio frequency module 1A according to the working example 1 while omitting the description regarding the same points.

The radio frequency module 1F according to the present modified example is connected to an external board (mother board). The foregoing external board is arranged on the module board 70B side (z-axis negative direction side) of the module boards 70A and 70B in such a manner as to be opposite the module board 70B.

The module board 70A is the first mounting board that has a principal surface 704 (first principal surface) and a principal surface 703 (second principal surface) that are opposite each other.

The module board 70B is the second mounting board that has a principal surface 702 (third principal surface) and a principal surface 701 (fourth principal surface) that are opposite each other, and the principal surface 702 faces the principal surface 703.

The transmission filter 12 has the mounting surface 122 (first mounting surface) and the top surface 121 (first top surface) that are opposite each other and is arranged in the inner space formed between the module board 70A and the module board 70B. Further, the mounting surface 122 is mounted on the principal surface 703 with bump electrodes interposed therebetween. In other words, the transmission filter 12 is mounted in such a way that the mounting surface 122 faces the principal surface 703. Note that the medium for connecting the mounting surface 122 and the principal surface 703 does not need to be the bump electrodes and may alternatively be a metal electrode layer. The output terminal 12c of the transmission filter 12 is arranged on the top surface 121.

The reception filter 22 has the mounting surface 222 (second mounting surface) and the top surface 221 (second top surface) that are opposite each other and is arranged in the foregoing inner space. Further, the mounting surface 222 is joined to the principal surface 702 with a metal electrode layer interposed therebetween. In other words, the reception filter 22 is mounted in such a way that the mounting surface 222 faces the principal surface 702. The input terminal 22a and the output terminal 22b of the reception filter 22 are arranged on the top surface 221. Alternatively, the reception filter 22 may be connected to the principal surface 702 with the bump electrodes, which are formed on the mounting surface 222, interposed therebetween.

Further, a common input terminal 22c of the reception filter 22 is arranged on the top surface 221 and electrically connected to the input terminal 22a inside the reception filter 22. The common input terminal 22c is a terminal that lies between the input terminal 22a and the common terminal 100 (external connection terminal 71b). Note that in FIG. 8, the common input terminal 22c and the input terminal 22a are illustrated as separate terminals. Alternatively, the common input terminal 22c and the input terminal 22a may form a single terminal on the top surface 221. In such case, the terminal formed by uniting the common input terminal 22c and the input terminal 22a has, on the top surface 221, an area to which the connection electrode 82b is joined and an area to which the bonding wire 83a is joined.

The common terminal 100 is the external connection terminal 71b arranged on the principal surface 701 of the module board 70B.

As illustrated in FIG. 8, when the module boards 70A and 70B are seen in a plan view, the footprint of the transmission filter 12 at least partially overlaps the footprint of the reception filter 22.

Further, as illustrated in FIG. 8, the radio frequency module 1F further includes the connection electrodes 81b and 82b that connect the output terminal 12c of the transmission filter 12 and the input terminal 22a of the reception filter 22 and the anisotropic conductive film 60. The connection electrodes 81b and 82b and the anisotropic conductive film 60 are arranged in the inner space formed between the module board 70A and module board 70B and are all conductive members that are not routed through the module board 70A or 70B (principal surface 702 or 703).

The foregoing configuration enables to reduce the area of the radio frequency module 1F. Further, the output terminal 12c and the input terminal 22a are connected on the respective top surfaces thereof with the conductive members, which are not routed through the principal surface 702 or 703, interposed therebetween. This enables to shorten the sum of wiring lengths of the connection wiring between the common terminal 100 and the input terminal 22a of the reception filter 22 and the connection wiring between the common terminal 100 and the output terminal 12c of the transmission filter 12. Accordingly, it becomes possible to reduce the transmission loss of a radio frequency signal while downsizing the radio frequency module 1F.

Further, it becomes possible to dissipate the heat generated in the transmission filter 12 not only from the module board 70A on which the transmission filter 12 is mounted but also from the module board 70B via the foregoing conductive members and the reception filter 22. Therefore, the heat dissipation property of the transmission filter 12 is improved.

Further, in the radio frequency module 1F according to the present modified example, the common terminal 100 (external connection terminal 71b) and the common input terminal 22c are connected by the via conductor 72b and the bonding wire 83a. The via conductor 72b is a via conductor that penetrates through the module board 70B and is connected to the common terminal 100 (external connection terminal 71b) at one end portion and to the bonding wire 83a at the other end portion. The bonding wire 83a is connected to the other end portion of the via conductor 72b and the common input terminal 22c.

The foregoing configuration enables to shorten the wiring connecting the input terminal 22a of the reception filter 22 and the common terminal 100 (external connection terminal 71b). Therefore, in particular, the transmission loss of a radio frequency reception signal can be reduced.

Other Embodiments and the Like

The radio frequency modules and the communication device according to the present disclosure are described using the working example and the modified examples. However, the radio frequency module and the communication device according to the present disclosure are not limited to the foregoing working example and modified examples thereof. Other embodiments realized by combining arbitrary constituent elements of the foregoing working example and modified examples, modified examples obtained by applying various modifications apparent to those skilled in the art to the foregoing working example and modified examples without departing the scope of the present disclosure, and various devices including the foregoing radio frequency module and communication device may also be included in the present disclosure.

For example, in the radio frequency modules and the communication device according to the foregoing embodiment, another circuit element, wiring, or the like may be inserted in a path connecting a circuit element and a signal path disclosed in the drawings.

The present disclosure can be widely used in communication devices such as cellular phones and the like as a small-sized radio frequency module to be arranged in a front-end unit.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A radio frequency module comprising:
 a first mounting board having a first principal surface and a second principal surface that are opposite each other;

a second mounting board having a third principal surface and a fourth principal surface that are opposite each other, the third principal surface facing the second principal surface;

a transmission filter having a first mounting surface and a first top surface that are opposite each other, the transmission filter arranged in an inner space formed between the first mounting board and the second mounting board and mounted so that the first mounting surface faces the second principal surface;

a reception filter having a second mounting surface and a second top surface that are opposite each other, the reception filter arranged in the inner space and mounted so that the second mounting surface faces the third principal surface; and a common terminal arranged on the first principal surface or the fourth principal surface, the common terminal being electrically connected to an output terminal of the transmission filter and an input terminal of the reception filter, wherein when the first mounting board and the second mounting board are viewed in a plan view, a footprint of the transmission filter at least partially overlaps a footprint of the reception filter, the output terminal of the transmission filter is arranged on the first top surface, the input terminal of the reception filter is arranged on the second top surface, the output terminal of the transmission filter and the input terminal of the reception filter are connected by a conductive member that is arranged in the inner space and not routed through the first mounting board or the second mounting board, the common terminal is arranged on the first principal surface, an input terminal of the transmission filter and a common output terminal of the transmission filter are each arranged on the first top surface, the common output terminal of the transmission filter being electrically connected to the output terminal of the transmission filter inside the transmission filter, and the common terminal and the common output terminal of the transmission filter are connected by a first via conductor and a bonding wire, the first via conductor penetrating through the first mounting board and being connected to the common terminal, the bonding wire connecting the first via conductor and the common output terminal of the transmission filter.

2. The radio frequency module of claim 1, wherein a ground terminal of the transmission filter is arranged on the first mounting surface and is connected to a second via conductor that penetrates through the first mounting board.

3. The radio frequency module of claim 1, wherein the input terminal of the transmission filter, the common output terminal of the transmission filter, and a ground terminal of the transmission filter are each arranged on the first mounting surface, the common output terminal of the transmission filter being electrically connected to the output terminal of the transmission filter inside the transmission filter.

4. The radio frequency module of claim 3, wherein the common terminal and the common output terminal of the transmission filter are connected by a third via conductor, the third via conductor penetrating through the first mounting board and being connected to the common terminal.

5. The radio frequency module of claim 4, wherein the ground terminal of the transmission filter is connected to a second via conductor that penetrates through the first mounting board.

6. The radio frequency module of claim 1, wherein the common terminal is arranged on the fourth principal surface.

7. The radio frequency module of claim 6, wherein an output terminal of the reception filter and a common input terminal of the reception filter are each arranged on the second top surface, the common input terminal of the reception filter being electrically connected to the input terminal of the reception filter inside the reception filter.

8. The radio frequency module of claim 7, wherein the common terminal and the common input terminal of the reception filter are connected by a via conductor and a bonding wire, the via conductor penetrating through the second mounting board and being connected to the common terminal, the bonding wire connecting the via conductor and the common input terminal of the reception filter.

9. The radio frequency module of claim 1, wherein the conductive member is arranged between the first top surface and the second top surface and includes an anisotropic conductive member.

10. The radio frequency module of claim 9, wherein the anisotropic conductive member is conductive in a direction vertical to the second principal surface and the third principal surface compared with a direction parallel to the second principal surface and the third principal surface.

11. The radio frequency module of claim 1, further comprising:
a transmission power amplifier mounted on the second principal surface and configured to output a radio frequency transmission signal to the transmission filter; and
a reception low noise amplifier mounted on the third principal surface and configured to amplify a radio frequency reception signal output from the reception filter.

12. The radio frequency module of claim 11, wherein when the first mounting board and the second mounting board are viewed in a plan view, a footprint of the transmission power amplifier does not overlap a footprint of the reception low noise amplifier.

13. The radio frequency module of claim 12, further comprising:
a transmission matching circuit arranged in a path connecting the input terminal of the transmission filter and an output port of the transmission power amplifier, the transmission matching circuit configured to provide impedance matching between the transmission filter and the transmission power amplifier; and
a reception matching circuit arranged in a path connecting the output terminal of the reception filter and an input port of the reception low noise amplifier, the reception matching circuit configured to provide impedance matching between the reception filter and the reception low noise amplifier.

14. The radio frequency module of claim 13, wherein when the first mounting board and the second mounting board are viewed in a plan view, at least one of the transmission filter, the reception filter, the transmission power amplifier, and the reception low noise amplifier is arranged between the transmission matching circuit and the reception matching circuit.

15. The radio frequency module of claim 14, wherein the transmission matching circuit includes a first inductor, the reception matching circuit includes a second inductor, and a magnetic flux direction of the first inductor crosses and a magnetic flux direction of the second inductor.

16. The radio frequency module of claim 1, further comprising:

a resin member formed in the inner space and that at least partially covers the transmission filter and the reception filter;

a ground electrode layer formed of plane wiring patterns of the first mounting board and the second mounting board; and a shield electrode layer formed so as to cover the first principal surface or the fourth principal surface, the shield electrode layer being connected to the ground electrode layer on side surfaces of the first mounting board and the second mounting board.

17. A communication device comprising:

an RF signal processing circuit that performs processing on a radio frequency signal to be transmitted or received by an antenna element; and a radio frequency module configured to transmit the radio frequency signal between the antenna element and the RF signal processing circuit, wherein the radio frequency module includes a first mounting board having a first principal surface and a second principal surface that are opposite each other;

a second mounting board having a third principal surface and a fourth principal surface that are opposite each other, the third principal surface facing the second principal surface;

a transmission filter having a first mounting surface and a first top surface that are opposite each other, the transmission filter arranged in an inner space formed between the first mounting board and the second mounting board and mounted so that the first mounting surface faces the second principal surface;

a reception filter having a second mounting surface and a second top surface that are opposite each other, the reception filter arranged in the inner space and mounted so that the second mounting surface faces the third principal surface; and a common terminal arranged on the first principal surface or the fourth principal surface, the common terminal being electrically connected to an output terminal of the transmission filter and an input terminal of the reception filter, wherein when the first mounting board and the second mounting board are viewed in a plan view, a footprint of the transmission filter at least partially overlaps a footprint of the reception filter, the output terminal of the transmission filter is arranged on the first top surface, the input terminal of the reception filter is arranged on the second top surface, the output terminal of the transmission filter and the input terminal of the reception filter are connected by a conductive member that is arranged in the inner space and not routed through the first mounting board or the second mounting board, the common terminal is arranged on the first principal surface, an input terminal of the transmission filter and a common output terminal of the transmission filter are each arranged on the first top surface, the common output terminal of the transmission filter being electrically connected to the output terminal of the transmission filter inside the transmission filter, and the common terminal and the common output terminal of the transmission filter are connected by a first via conductor and a bonding wire, the first via conductor penetrating through the first mounting board and being connected to the common terminal, the bonding wire connecting the first via conductor and the common output terminal of the transmission filter.

* * * * *